United States Patent [19]
Weber

[11] Patent Number: 5,986,613
[45] Date of Patent: Nov. 16, 1999

[54] ELECTRIC CONTACT AND PROCESS FOR PRODUCING ELECTRIC CONTACT

[75] Inventor: Klaus Weber, Kronberg, Germany

[73] Assignee: VDO Adolf Schindling AG, Frankfurt, Germany

[21] Appl. No.: 08/807,990

[22] Filed: Mar. 3, 1997

[30] Foreign Application Priority Data

Mar. 6, 1996 [DE] Germany ............................ 196 08 661

[51] Int. Cl.⁶ ...................................................... H01Q 1/32

[52] U.S. Cl. .......................... 343/713; 343/711; 343/712; 343/704; 174/94 R

[58] Field of Search .......................... 73/29.01; 343/704, 343/711, 712, 713; 333/132; H01Q 1/32

[56] References Cited

U.S. PATENT DOCUMENTS

| | | | |
|---|---|---|---|
| 4,864,316 | 9/1989 | Kaoru et al. | 343/704 |
| 5,534,879 | 7/1996 | Braun et al. | 343/713 |

*Primary Examiner*—Don Wong
*Assistant Examiner*—James Clinger
*Attorney, Agent, or Firm*—Martin A. Farber

[57] ABSTRACT

An electric contact for connecting a conductive system present on an insulating substrate, in particular for automobile windshields, in which the conductive system is connected via a conductive path with an electric mating contact. A moisture-resistant electric contact which is easy to manufacture and can be universally used consists of a conductive path which is disposed directly on a support substrate as a path-shaped conductive layer on which an electric connecting line of the conductive system is located.

16 Claims, 3 Drawing Sheets

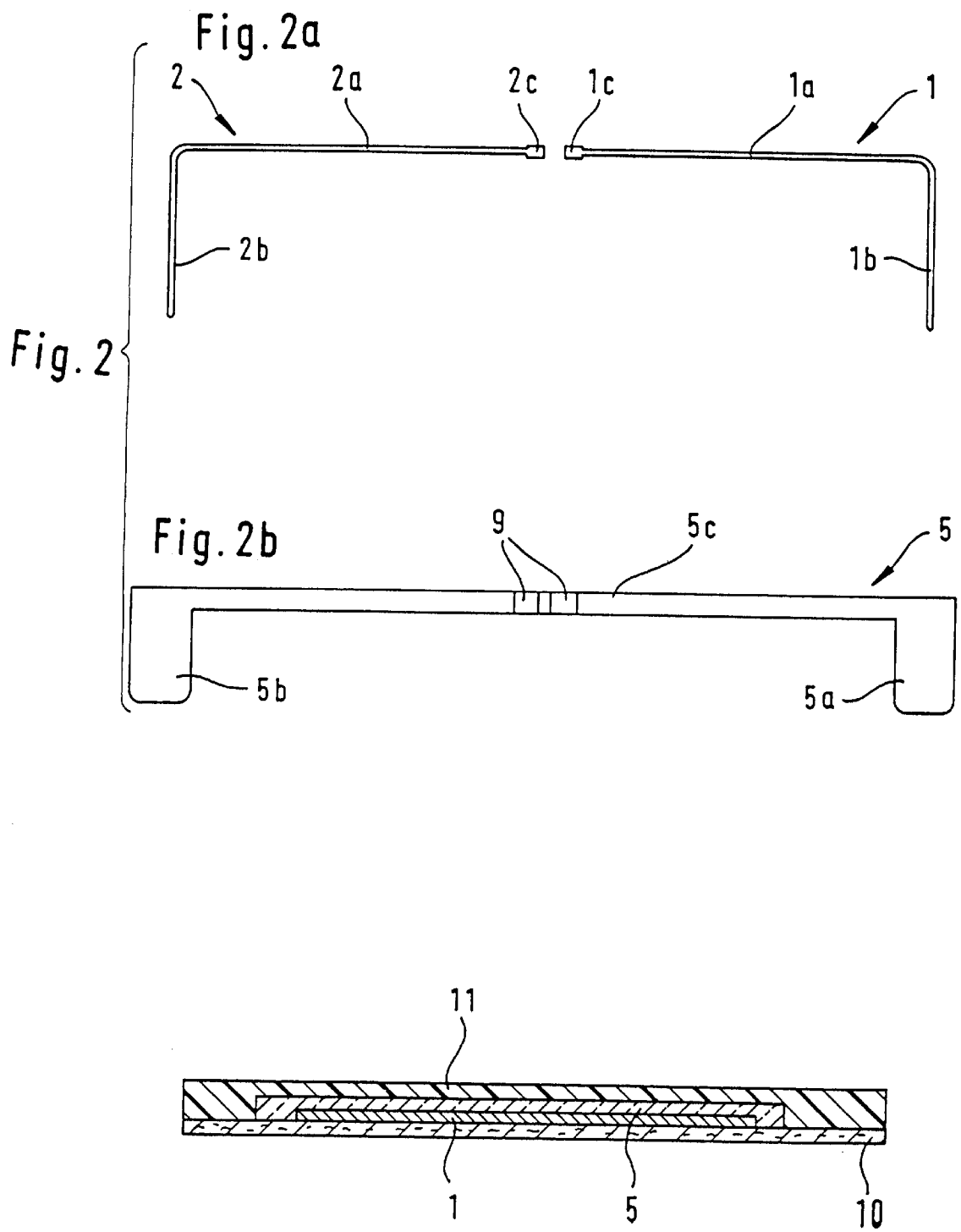

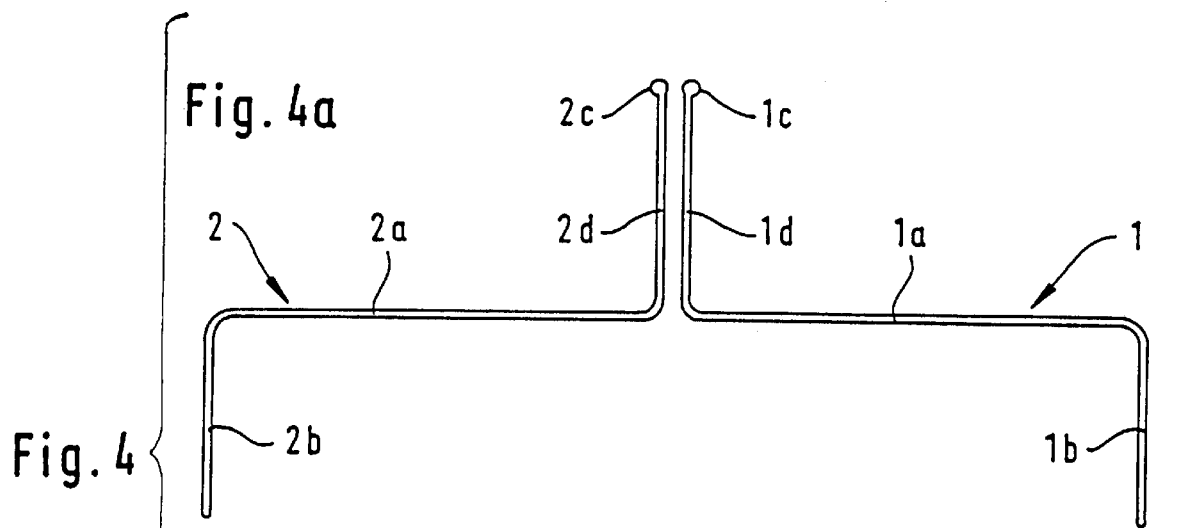
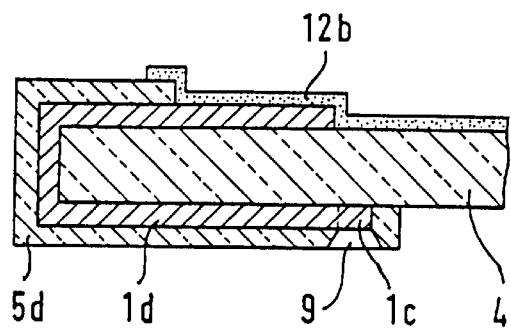
Fig. 5

ELECTRIC CONTACT AND PROCESS FOR PRODUCING ELECTRIC CONTACT

FIELD AND BACKGROUND OF THE INVENTION

The present invention relates to an electric contact for connecting a conductive system present on an insulating substrate, in particular for automobile windshields, in which the conductive system is connected via a conductive path with an electric mating contact, and a process for producing this electrical contact.

Metallic, electrically conductive layers on the outside of automobile windshields serve, for instance, to form a resistive rain sensor. However, they can also be used for the electrical heating of the windshield or to form an antenna for a radio.

These electrically conductive layers must be connected to electric connections within the vehicle for the supplying of voltage or the evaluation of different electric signals.

The outside of the windshield is in this case, as is known, exposed to the action of water and dirt. Deposits of water and salts are formed by action of a windshield wiper, in particular on the edge of the windshield. The windshield is capped in most cases by a windshield gasket.

The metallic character of the conductive layers together with the deposits of water and salts which build up at these places leads to short circuits.

In accordance with Federal Republic of Germany 44 23 888 A1, a compact device is known for contacting a moisture sensor which is present on the outside of the motor vehicle. In that case, a conductive path is arranged on a flexible support, said conductive path being bent in form-locked manner around the edge of the windshield with the aid of a layer of a hot adhesive, the layer of hot adhesive facing the windshield.

Such a compact contact requires additional assembling steps for manufacture. Furthermore, with this arrangement, problems as to corrosion and tightness occur due to a locating of the compact contact below the windshield gasket, which problems lead to an impairment or failure of measurement results.

SUMMARY OF THE INVENTION

It is an object of the invention to provide a moisture resistant electrical contact which is easy to produce and can be used universally.

According to the invention, a conductive layer arranged in the manner of a path directly on a supporting substrate (4), is provided as conductive path (1, 2), an electric connecting line (12a, 12b) of the conductive arrangement (12) being disposed on the layer.

As a result of the fact that the contact is developed as a conductive layer, it can be applied during the course of the production of the insulating substrate, in particular a car windshield. No additional contacting step is required.

The path-shaped conductive layer advantageously grips around the edge of the insulating substrate. Sealing problems between windshield and car body do not occur in view of the slight thickness of the conductive layer.

For the electrical contacting of the conductive layer (1, 2) with the mating contact (7, 8), the conductive layer can be soldered or bonded.

In one embodiment, the conductive layer (1, 2) is provided with an insulating layer (5). The conductive layer (1, 2) extends out below the insulating layer (5) for the contacting of the conductive system. The electric connecting line (12a, 12b) of the conductive system (12) is located on an outward-extending part (1b, 2b) of the conductive layer.

The advantage of the invention is that, due to the insulation, short circuits are prevented in the region of the windshield capping. The electronic arrangement itself can in this connection be arranged sufficiently far from the edge of the substrate. Short circuits which are caused by the depositing of conductive residues, such as salts below the capping of the substrate, thus have no influence on the electric system.

The insulating layer (5) is furthermore so arranged that, lying over the conductive layer, it grips around the edge of the substrate.

The invention also provides that the insulating layer (5) is a layer of glass.

The invention further provides that the insulating substrate (4) is a pane of glass.

Another feature of the invention is that the conductive layer (1, 2) is a layer produced by the screen-printing technique.

Still another feature is that the conductive layer (1, 2) can be sintered to the insulating layer.

The conductive system (12) has one or more conductive layers arranged in a given pattern on the support substrate (4). In this connection, the conductive system (12) is applied by sputtering to the conductive contact layer (1, 2) and the insulating layer (5).

It is also possible to bond or solder the conductive system (12) in place. Application by a silk-screening technique is also possible.

In one method for producing the electric contact, the conductive layer (1, 2) is first of all applied to a flexible support sheet (10). Thereupon, the insulating layer (5) is arranged on the conductive layer (1, 2) and the side of the support sheet (10) bearing the conductive layer (1, 2) is covered by a flexible foil layer (11), the adherence of which to the conductive layer (1, 2) and the insulating layer (5) is greater than the adherence of the support sheet (10) to the conductive layer (1, 2) and the insulating layer (5). The support sheet (10) is separated from the foil layer (11) bearing the conductive layer (1, 2) and the insulating layer (5). The flexible foil layer (11) is so positioned on the insulating substrate (4) that the conductive layer (1, 2) rests directly on the substrate (4) and whereupon the support substrate (4) with the foil layer (11) is acted on by heat in order to burn off the foil layer.

By means of this method, it is possible to produce insulated contacts at little expense. The contact can be easily extended around the edge of the substrate. This type of contacting can be carried out technically in elegant manner.

In one embodiment, the conductive path is made of a sintered conductive layer produced by a printing technique by means of a conductive paste, the layer being applied directly on the insulating substrate, in which connection the conductive paste contains conductive particles and a glass frit which can melt at a lower temperature than the material of the insulating support substrate.

Another feature of the invention is that the conductive particles are particles of silver.

BRIEF DESCRIPTION OF THE DRAWINGS

With the above and other objects and advantages in view, the present invention will become more clearly understood in connection with the detailed description of preferred embodiments, when considered with the accompanying drawings, of which:

FIG. 2 comprises FIG. 2a and FIG. 2b to show a first layout of the conductive paths (FIG. 2a) and an insulating layer (FIG. 2b) as used in FIG. 1;

FIG. 3 is a side sectional view of an embodiment of the electric contact;

FIG. 4 comprises FIGS. 4a and 4b to present a second layout of conductive paths (FIG. 4a) and the corresponding insulating layer (FIG. 4b); and FIG. 5 is a diagrammatic showing, in sectional view, of the production of the electric contact over the edge of the windshield in the example of the conductive path 1.

DETAILED DESCRIPTION OF THE PREFERRED EMBODIMENTS

Figure 1:
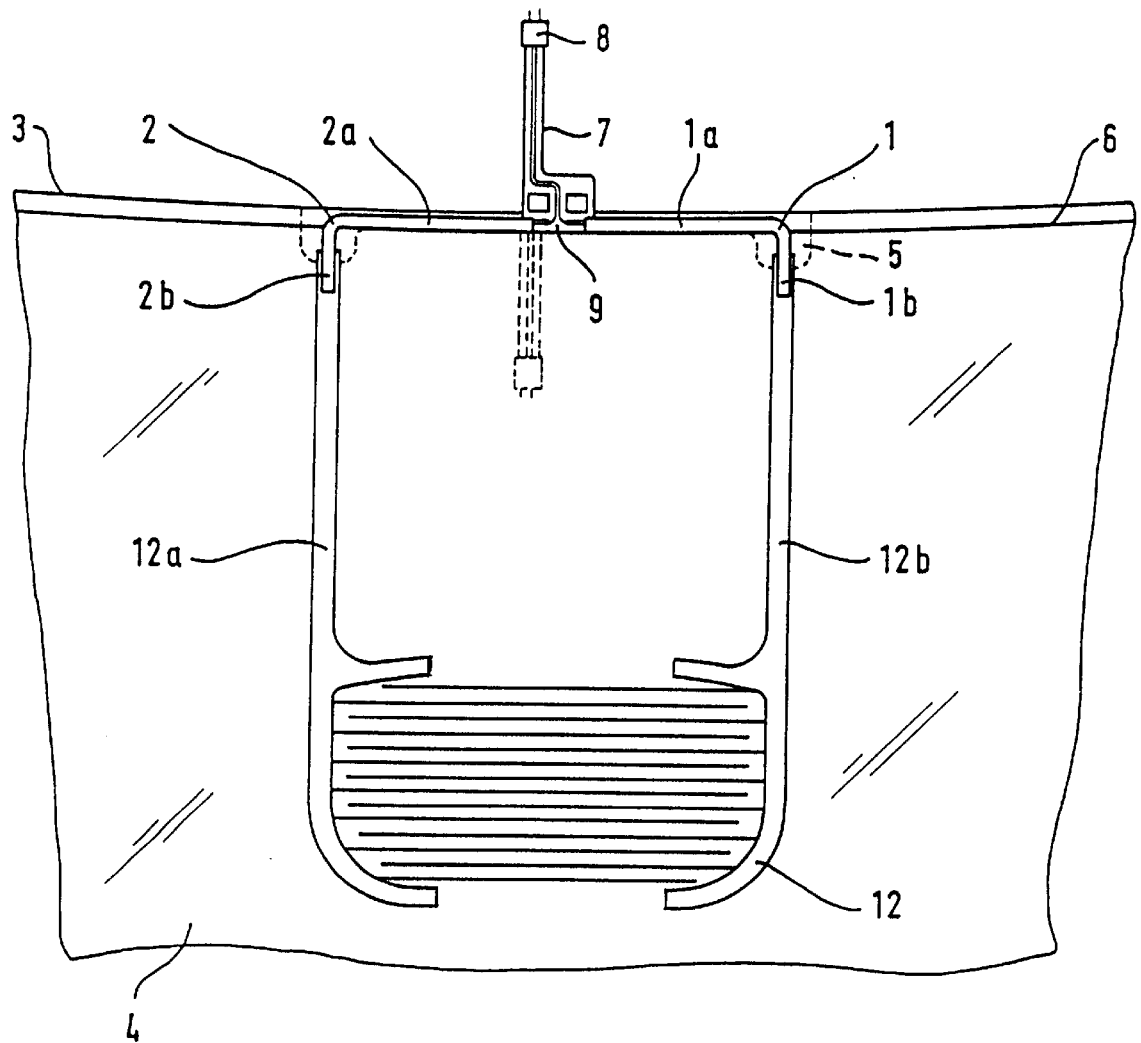
FIG. 1 is a top view of the electric contact of the invention, contacted with a sensor.

FIG. 1 shows the contacting of a moisture sensor 12 on a windshield 4 of a motor vehicle.

Two approximately L-shaped low-ohmic conductive paths 1 and 2 of mirror symmetry are arranged in the vicinity of the edge 3 of the vehicle windshield 4.

With reference also to FIGS. 2–5, on the conductive paths 1 and 2 there is arranged a single-piece glass layer 5 which is approximately of U-shape. The dimensions of the layer of glass 5 are so selected that the part 5c extending parallel to the edge 3 of the windshield completely covers the corresponding sections 1a, 2a of the conductive paths 1 and 2. The part 5c of the insulating layer 5 is approximately twice as wide as the sections 1a, 2a of the conductive paths.

The arms 5a and 5b of the layer of glass 5 are approximately five times as wide as the arms 1b, 2b of the conductive paths 1 and 2 but shorter, so that the arms 1b and 2b of the conductive paths 1 and 2 extend out below the arms 5a and 5b of the layer of glass 5.

The layer of glass 5 is provided in this connection approximately centrally in the section 5c extending parallel to the edge 3 of the windshield with at least one, and preferably two, contact openings 9 to which a flexible circuit board 7 having a two-pin plug 8 present thereon which leads to a signal evaluation unit (not shown) is connected. The contact openings 9 of the layer of glass 5 are so arranged over the contact islands 1c and 2c of the conductive paths 1 and 2 that the contact islands lie completely free, and electric lines of the flexible circuit board 7 can be bonded or soldered in the region of the contact islands 1c and 2c to the conductive paths 1 and 2 (FIG. 2).

The use of two contact openings 9 in the layer of glass 5 instead of one large-area contact opening 9 has the advantage of a reliable insulating of the conductive-path connections from each other.

The length of the parts 5a, 5b, as well as the width of the part 5c of the layer of glass 5, are so dimensioned that the free conductive-path sections 1b, 2b are sufficiently far from the region 6 of the edge of the windshield 4. The edge region 6 extends parallel to the edge 3 of the windshield in a region of approximately 0.5 to 10 cm. starting from the edge 3 of the windshield.

The conductive paths 1 and 2 and the layer of glass 5 are applied to the car windshield in accordance with the principle of a transfer picture (decalcomania).

In the case of the present embodiment shown in FIG. 3, a conductive path containing silver particles and glass frit is applied to a support sheet 10 of, for instance, paper in the design of the conductive paths 1 and 2, and dried.

Thereupon, a layer is glass in predetermined dimensions is applied as insulating layer 5 on the conductive paths 1 and 2 and also dried.

The conductive-paste pattern and the layer of glass are then coated over their entire surface with a synthetic resin paste which, upon drying, forms a flexible foil layer 11.

In the case of conductive paths 1 and 2 which have been prepared in this manner, after the pulling-off of the support sheet 10, the flexible sheet 11 is so positioned on the car windshield 4 that the conductive paths 1 and 2 lie directly on the windshield 4. Since the foil 11 has adhesive properties, it remains in the position in which it has been applied to the car windshield.

By the action of heat on the car windshield 4 in a bending oven with a temperature of about 600° C. there take place simultaneously a sintering of the conductive paste and of the layer of glass on the vehicle windshield 4, a residue-free gasification of the flexible foil 11, and a bending deformation of the windshield 2 from its flat shape into a curved shape, all in one operation. The electric contact thus produced is then connected in non-detachable manner to the windshield 4.

The conductive paths 1, 2 have in this connection a thickness of about 10 to 20 $\mu$m. The glass layer 5 is at least three times as thick.

In a following step, the resistive rain sensor is then applied onto the electric contacts which have been sintered in this way in one step with the bending of the windshield. This is done by a thin-film technique. The resistive rain sensor, which is also shown diagrammatically in FIG. 1, consists in this connection, as known, of two sensor conductive paths which mesh in comb-like manner in each other, each sensor conductive path having a connecting line 12a and 12b.

These connecting lines 12a and 12b are precisely the same distance apart as the contact conductive-path sections 1a and 1b. The connecting lines 12a and 12b are applied by sputtering over the conductive-path sections 1b and 2b, whereby an electric connection is produced between the conductive system 12, illustrated as a rain sensor and its contact.

The sensor preferably consists of chromium and chromium nitride and is only a few atomic layers thick.

The manner of operation of a resistive rain sensor is well known to the person skilled in the art and need therefore not be described further.

In another embodiment, shown in FIGS. 4 and 5, the approximately L-shaped conductive paths 1 and 2 are provided at their ends facing each other with in each case an extension 1d, 2d. The layer of glass 5 is also provided with an extension 5d, which covers the conductive-path extensions 1d, 2d. The foil layer provide with these structure is placed in known manner on the windshield. In this connection, it is provided that the extensions 1d, 2d and 5d extend over the edge 3 of the windshield 4 and are wrapped around it to the rear of the windshield 4. The sintering of the conductive paths 1 and 2 is then effected at a temperature which corresponds approximately to the deformation temperature of the plastic deformation of the pane of glass, preferably at 500° C. to 700° C.

I claim:

1. An electric contact for connecting a conductive system present on an insulating support substrate, including an automobile windshield, in which the conductive system is connected via a conductive path with an electric mating contact, the electric contact comprising:

a path-shaped conductive layer arranged in the manner of a path directly on a surface of the insulating support substrate exposed to an external environment, and serving as a conductive path;

an insulating layer covering at least a part of the path-shaped conductive layer to prevent development of a short circuit from exposure to the environment; and wherein an electric connecting contact of the conductive system is disposed on said conductive layer.

2. An electric contact according to claim 1, wherein the path-shaped conductive layer grips around the edge of the insulating substrate.

3. An electric contact according to claim 2, wherein, for a contacting of the conductive layer with the mating contact, the conductive layer is connectable with the mating contact by soldering or bonding.

4. An electric contact according to claim 1, wherein the insulating layer overlays said conductive layer;

the conductive layer extends out below the insulating layer for contacting of the conductive system; and an electric connecting line of the conductive system is arranged on an outward-extending part of the conductive layer.

5. An electric contact according to claim 1, wherein said insulating layer lies upon the conductive layer and grips around an edge of the substrate.

6. An electric contact according to claim 1, wherein the insulating layer comprises glass.

7. An electric contact according to claim 6, wherein the insulating substrate is a pane of glass.

8. An electric contact according to claim 1, wherein the conductive layer is producable by a screen-printing technique.

9. An electric contact according to claim 1, wherein the conductive layer is connectable to said substrate by sintering.

10. An electric contact according to claim 1, wherein the contact is a laminated structure, and the conductive system has at least one conductive contact layer arranged in a given pattern on the support substrate.

11. An electric contact according to claim 10, wherein the conductive contact layer and the insulating layer are connectable to the conductive system by a sputtering.

12. An electric contact according to claim 10, wherein the conductive contact layer and the insulating layer are connectable to the conductive system by a bonding.

13. An electric contact according to claim 10, wherein the conductive contact layer and the insulating layer are connectable to the conductive system by a soldering.

14. An electric contact according to claim 10, wherein the conductive contact layer and the insulating layer are connectable to the conductive system by a silk-screening technique.

15. Electric contact for connecting a rain sensor which is arranged on an automobile windshield, the moisture sensor having two electrodes each of which comprises a conductive layer supported by the windshield, the contact comprising:

two conductive tracks arranged directly in the vicinity of an edge of the automobile windshield and extending to reach the electrodes of the sensor;

an insulating layer covering the conductive tracks and serving to prevent short circuits, induced by exposure to the atmosphere, in a region of the windshield edge.

16. Electric contact according to claim 15, wherein the insulating layer comprises a one-part glass layer which covers the two conductive tracks, wherein a part of the glass layer runs parallel to the windshield edge and completely covers corresponding portions of the conductive tracks, while exposing end portions of the conductive tracks to permit electrical contact with the electrodes of the rain sensor.

\* \* \* \* \*